United States Patent
Kelkar

(10) Patent No.: US 7,282,375 B1
(45) Date of Patent: Oct. 16, 2007

(54) WAFER LEVEL PACKAGE DESIGN THAT FACILITATES TRIMMING AND TESTING

(75) Inventor: Nikhil Vishwanath Kelkar, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 219 days.

(21) Appl. No.: 10/824,903

(22) Filed: Apr. 14, 2004

(51) Int. Cl.
 *G01R 31/26* (2006.01)
 *H01L 21/66* (2006.01)

(52) U.S. Cl. .............................. 438/15; 257/E21.531

(58) Field of Classification Search .................. 438/15
 See application file for complete search history.

(56) References Cited

U.S. PATENT DOCUMENTS

| | | | |
|---|---|---|---|
| 5,008,189 A | 4/1991 | Oroskar et al. | |
| 5,128,746 A | 7/1992 | Pennisi et al. | |
| 5,136,365 A | 8/1992 | Pennisi et al. | |
| 5,214,308 A | 5/1993 | Nishiguchi et al. | |
| 5,244,143 A | 9/1993 | Ference et al. | |
| 5,250,843 A | 10/1993 | Eichelberger | |
| 5,329,423 A | 7/1994 | Scholz | |
| 5,376,403 A | 12/1994 | Capote et al. | |
| 5,495,439 A | 2/1996 | Morihara | |
| 5,500,534 A | 3/1996 | Robinson et al. | |
| 5,587,342 A | 12/1996 | Lin et al. | |
| 5,668,059 A | 9/1997 | Christie et al. | |
| 5,698,894 A * | 12/1997 | Bryant et al. ............... | 257/629 |
| 5,736,456 A | 4/1998 | Akram | |
| 5,767,010 A | 6/1998 | Mis et al. | |
| 5,768,290 A * | 6/1998 | Akamatsu ................... | 714/732 |
| 5,773,359 A | 6/1998 | Mitchell et al. | |
| 5,872,633 A | 2/1999 | Holzapfel et al. | |
| 5,880,530 A | 3/1999 | Mashimoto et al. | |
| 5,895,976 A | 4/1999 | Morrell et al. | |
| 5,925,936 A | 7/1999 | Yamaji | |
| 5,937,320 A | 8/1999 | Andricacos et al. | |
| 5,953,623 A | 9/1999 | Boyko et al. | |
| 5,977,632 A | 11/1999 | Beddingfield | |

(Continued)

OTHER PUBLICATIONS

Kulicke & Soffa, Flip Chip Division, Polymer Collar™ Wafer Level Package; "Achieve Maximum Reliability for Wafer Level Packages!", Dec. 7, 2001, www.kns.com.

(Continued)

*Primary Examiner*—David A. Zarneke
(74) *Attorney, Agent, or Firm*—Beyer Weaver LLP

(57) ABSTRACT

A wafer level method of packaging, trimming and testing integrated circuits is described. A wafer having trim pads is bumped before the wafer is trimmed. After the bumping, the dice on the wafer are trimmed and tested using standard trim probing and test probing techniques. After the trimming and testing, an electrically insulative undercoating is applied to the active surface of the wafer. The undercoating directly covers the trim pads while leaving at least portions of the contact bumps exposed. The undercoating may be applied using a variety of different processes, including spin-on coating, molding, screen printing or stencil printing. The undercoating may be formed from a wide variety of material including epoxy, polyimide and silicone-polyimide copolymers. With this approach, the wafer may be trimmed and final tested at substantially the same stage of wafer processing. The trimming and testing operations may be performed either sequentially or substantially simultaneously.

13 Claims, 4 Drawing Sheets

U.S. PATENT DOCUMENTS

| | | | |
|---|---|---|---|
| 6,023,094 | A | 2/2000 | Kao et al. |
| 6,060,373 | A | 5/2000 | Saitoh |
| 6,063,647 | A | 5/2000 | Chen et al. |
| 6,071,757 | A | 6/2000 | Fogal et al. |
| 6,100,114 | A | 8/2000 | Milkovich et al. |
| 6,121,689 | A | 9/2000 | Capote et al. |
| 6,130,473 | A | 10/2000 | Mostafazadeh et al. |
| 6,171,887 | B1 | 1/2001 | Yamaji |
| 6,190,940 | B1 | 2/2001 | Defelice et al. |
| 6,228,678 | B1 | 5/2001 | Gilleo et al. |
| 6,245,595 | B1 | 6/2001 | Nguyen et al. |
| 6,258,626 | B1 | 7/2001 | Wang et al. |
| 6,288,444 | B1 | 9/2001 | Abe et al. |
| 6,297,560 | B1 | 10/2001 | Capote et al. |
| 6,307,269 | B1 | 10/2001 | Akiyama et al. |
| 6,316,528 | B1 | 11/2001 | Iida et al. |
| 6,327,158 | B1 * | 12/2001 | Kelkar et al. ............... 361/779 |
| 6,346,296 | B1 | 2/2002 | McCarthy et al. |
| 6,352,881 | B1 | 3/2002 | Nguyen et al. |
| 6,358,627 | B2 | 3/2002 | Benenati et al. |
| 6,372,547 | B2 | 4/2002 | Nakamura et al. |
| 6,391,683 | B1 | 5/2002 | Chiu et al. |
| 6,429,238 | B1 | 8/2002 | Sumita et al. |
| 6,455,920 | B2 | 9/2002 | Fukasawa et al. |
| 6,468,832 | B1 | 10/2002 | Mostafazadeh |
| 6,479,308 | B1 * | 11/2002 | Eldridge ...................... 438/14 |
| 6,486,562 | B1 | 11/2002 | Kato |
| 6,507,118 | B1 | 1/2003 | Schueller |
| 6,605,479 | B1 | 8/2003 | Pasadyn et al. |
| 6,649,445 | B1 | 11/2003 | Qi et al. |
| 6,683,379 | B2 | 1/2004 | Haji et al. |
| 6,791,194 | B1 | 9/2004 | Nagai et al. |
| 6,818,550 | B2 | 11/2004 | Shibata |
| 6,822,324 | B2 | 11/2004 | Tao et al. |
| 2002/0003299 | A1 | 1/2002 | Nakamura et al. |
| 2002/0014703 | A1 | 2/2002 | Capote et al. |
| 2002/0027257 | A1 | 3/2002 | Kinsman et al. |
| 2002/0031868 | A1 | 3/2002 | Capote |
| 2002/0109228 | A1 | 8/2002 | Buchwalter et al. |
| 2002/0171152 | A1 | 11/2002 | Miyazaki |
| 2003/0001283 | A1 | 1/2003 | Kumamoto |
| 2003/0013233 | A1 | 1/2003 | Shibata |
| 2003/0080360 | A1 * | 5/2003 | Lee et al. .................. 257/257 |
| 2003/0087475 | A1 | 5/2003 | Sterrett et al. |
| 2003/0099767 | A1 | 5/2003 | Fang |
| 2003/0127502 | A1 * | 7/2003 | Alvarez ...................... 228/246 |
| 2003/0129789 | A1 | 7/2003 | Smith et al. |
| 2003/0169064 | A1 * | 9/2003 | Pirkle et al. ................ 324/765 |
| 2003/0193096 | A1 | 10/2003 | Tao et al. |
| 2003/0218258 | A1 | 11/2003 | Charles et al. |
| 2004/0002181 | A1 | 1/2004 | Scheifers et al. |
| 2005/0516331 | | 7/2005 | Akram |
| 2005/0212142 | A1 | 9/2005 | Miyazaki et al. |

OTHER PUBLICATIONS

Kulicke & Soffa, Flip Chip Division, Polymer Collar™ Wafer Level Package, "See the Polymer Collar™ WLP Difference!", Dec. 7, 2001, www.kns.com.

Lau et al., "Chip Scale Package: Design, Materials, Process, Reliability, and Applications," Feb. 28, 1999, McGraw-Hill Professional Publishing; Chapter 1, pp. 1-41.

Rao R. Turnmala, "Fundamentals of Microsystem Packaging," May 8, 2001, McGraw-Hill Professional Publishing; Chapters 2, 10 and 17.

"Polymer Collar WLP™, Wafer Level Package Family", © 2002, downloaded from www.kns.com/prodserv/PDFS/FCD/polymer_collar.pdf, 2 pages.

"Presenting Polymer Collar WLP™—A New Wafer Level Package for Improved Solder Joint Reliability", © 2002, downloaded from www.kns.com/prodserv/flipchip/pdf/PC_ad.pdf, 1 page.

Barrett et al., Kulicke & Soffa, "Polymer Collar WLP™—A New Wafer Level Package for Improved Solder Joint Reliability", © 2002, downloaded from www.kns.com/resources/articles/PolymerCollar.pdf, 9 pages.

Bogatin, Eric, "All Dressed Up and Nowhere to Go"; Semiconductor International, May 1, 2002, downloaded Dec. 23, 2003, from www.reed-electronics.com/semiconductor/index.asp?layout=article@articleid=CA213812@rid=0&rme=0&cfd=1, 2 pages.

Nguyen et al., "Effect of Underfill Fillet Configuration on Flip Chip Package Reliability", SEMI® Technology Symposium: International Electronics Manufacturing Technology (IEMT) Symposium, SEMICON® West 2002.

U.S. Appl. No. 10/080,913, filed Feb. 21, 2002.
U.S. Appl. No. 10/224,291, filed Aug. 19, 2002.
U.S. Appl. No. 10/707,208, filed Nov. 26, 2003.

* cited by examiner

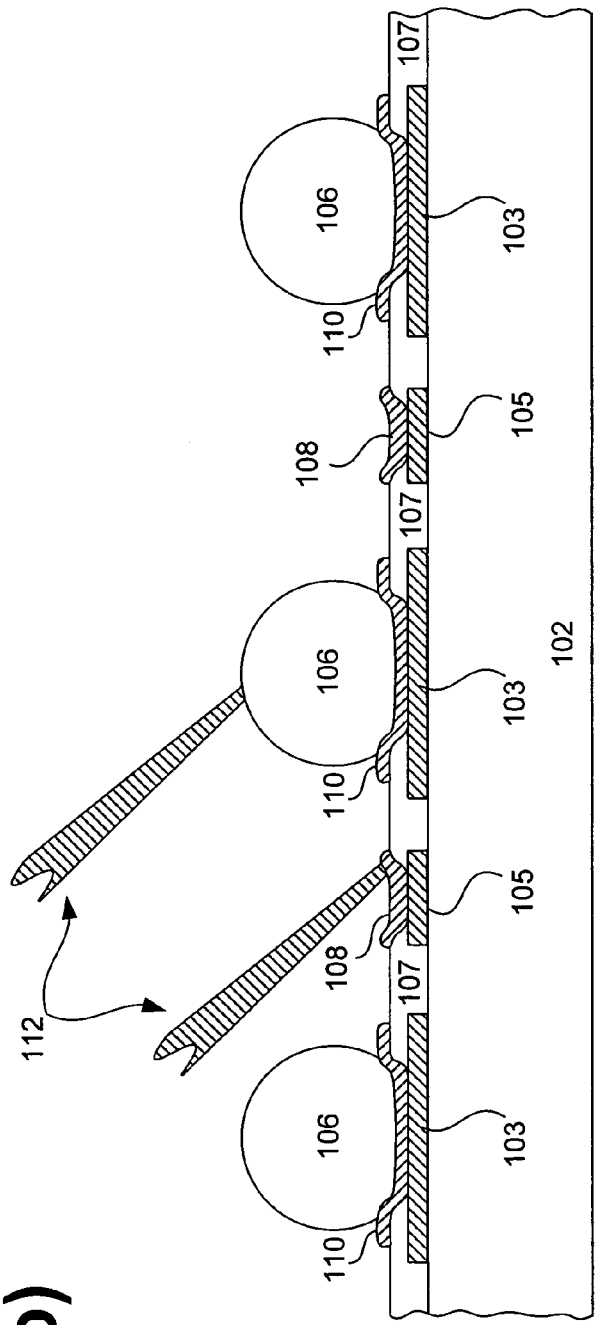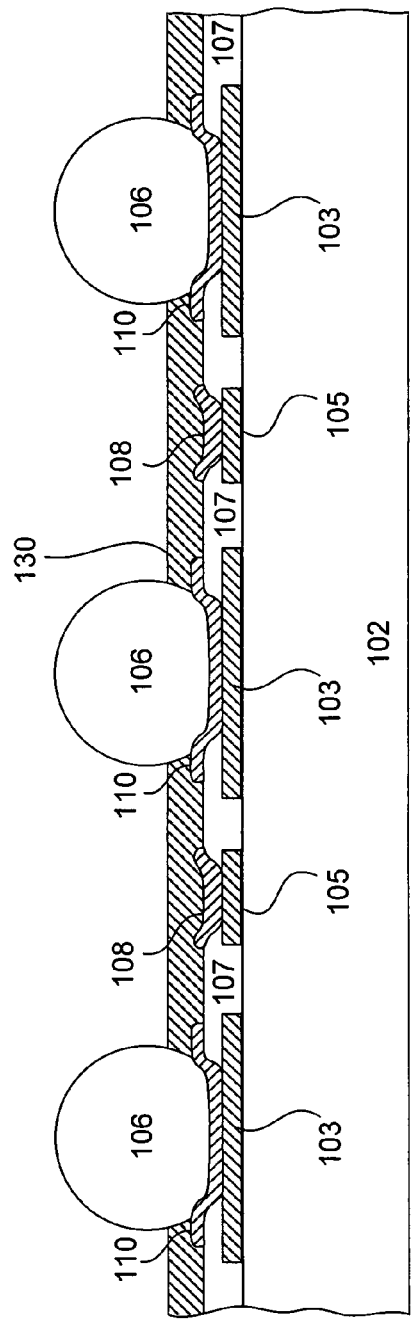

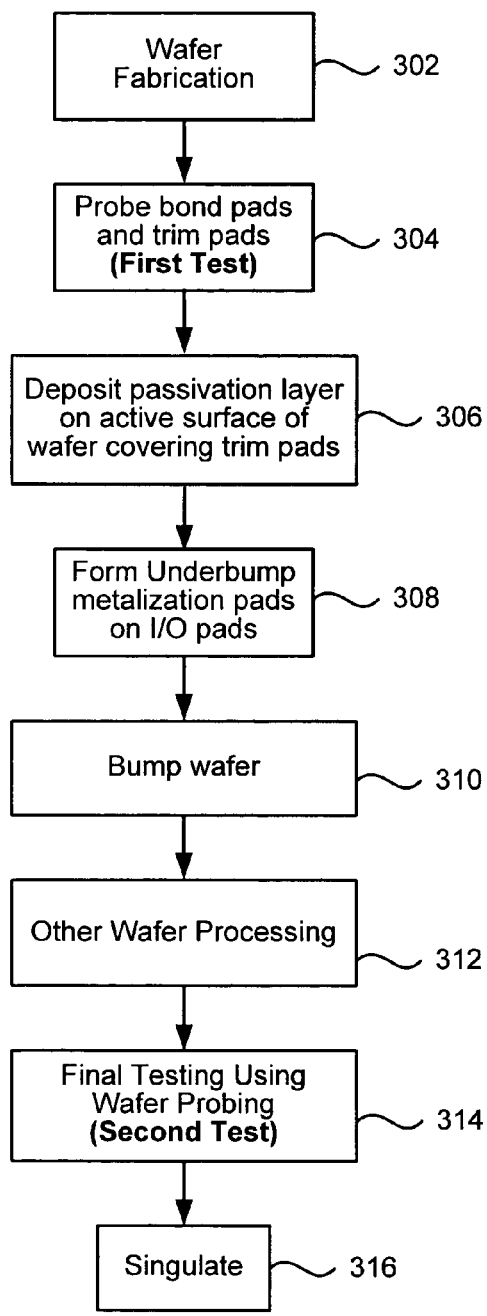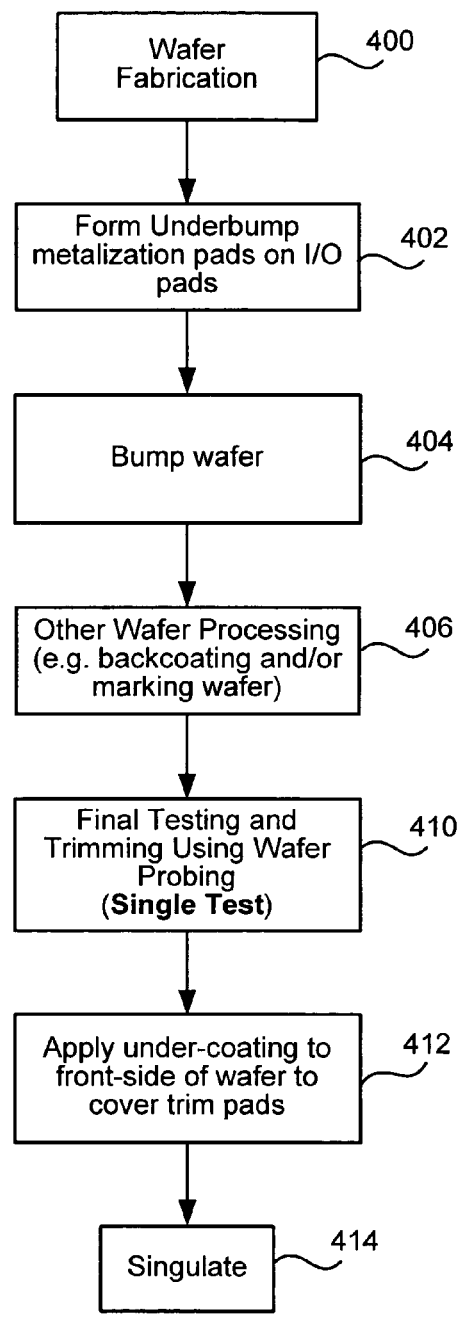

WAFER LEVEL PACKAGE DESIGN THAT FACILITATES TRIMMING AND TESTING

BACKGROUND

The present invention relates generally wafer level processing of integrated circuits. More particularly, a wafer level packaging arrangement is described that permits parameter trimming and final testing to be accomplished during a single probing sequence.

A variety of semiconductor devices (particularly precision analog semiconductor devices) require that the circuits be trimmed after fabrication. Generally, trimming is the process of fine-tuning the performance of an integrated circuit device after fabrication in order to ensure conformance to a desired performance specification. In order to facilitate trimming, it is common to provide metal pads, often referred to as "trim pads" on the active surface of the die. Generally, a specific current is applied to each trim pad at a specific voltage in order to activate components (e.g. fuses) that can adjust the performance of the circuits of interest.

There are a number of conventional processes for packaging integrated circuits. One approach that is commonly referred to as "flip chip" packaging generally contemplates forming solder bumps (or other suitable contacts) directly on the face of an integrated circuit die. In some situations, the contacts are formed directly on I/O pads formed on the die, whereas in other situations the contacts are redistributed. The die is then typically attached to a substrate such as a printed circuit board or a package substrate such that the die contacts directly connect to corresponding contacts on the substrate.

When trim pads are included in flip chip package designs (or other wafer level chip scale packages) it is common to deposit a passivation material over the trim pads after the device has been trimmed. By way of example, a representative process might proceed as illustrated in FIG. 5. Specifically, after the wafer is fabricated (302), the wafer is taken to a wafer prober which tests and trims the appropriate circuits (304). The trim pads are generally formed from aluminum and thus they will corrode if left exposed in an ambient environment. Also, if they are left exposed when the singulated die is soldered to a substrate, there is a significant risk that the solder may bridge the gap between one of the bond pad/trim pad pairs, thereby shorting out the die. To avoid these problems, some manufacturing approaches contemplate covering the trim pads with a passivation material after the wafer has been trimmed. This helps reduce corrosion of the trim pads but requires returning to the wafer to the wafer processing chamber where a passivation layer (e.g. polyimide or benzocyclobutene (BCB)) is applied over the trim pads (306). Typically, the passivation layer also extends over edge portions of the I/O pads as well. Thus, the passivation layer is used to isolate the trim pads.

After the passivation layer is applied, appropriate underbump metallization stacks are typically formed on the I/O pads (308) and the wafer is bumped (310). It should be appreciated that there may be a number of other processing steps that occur before, as part of, or after the bumping. When the desired processing is completed, the wafer is again taken to a wafer prober where the final testing occurs.

In this scenario, wafer probe testing must be done twice. Initially, the wafer must be probed to facilitate trimming, which must occur before the trim pads are insulated by the passivation material. The wafer must also be probed a second time to test for electrical function after the contact bumps have been placed on the dies. Although the described process works well, this two-part wafer probing process is inefficient, since the wafer must go to a testing facility for trimming, and subsequently, to a manufacturing facility to cover the trim pads and then back to the testing facility for the final wafer probing before the dies are cut and shipped to customers. These inefficiencies add to the overall cost of manufacturing these IC devices. Therefore, there are continuing efforts to reduce the costs and time associated with the manufacturing process.

SUMMARY

To achieve the foregoing and other objects of the invention, a wafer level method of packaging, trimming and testing integrated circuits is described. In a method aspect of the invention, a wafer having trim pads is bumped before the wafer is trimmed. After the bumping, the dice on the wafer are trimmed and tested using standard trim probing and test probing approaches. After the trimming and testing, an electrically insulative undercoating is applied to the active surface of the wafer. The undercoating directly covers the trim pads while leaving at least portions of the contact bumps exposed. With this approach, the wafer may be trimmed and tested at substantially the same stage of wafer processing. The trimming and testing operations may be performed either sequentially or substantially simultaneously.

The undercoating may be applied using a variety of different processes, including spin-on coating, molding, screen printing or stencil printing. The undercoating may be formed from a wide variety of material including epoxy, polyimide and silicone-polyimide copolymers. In some specific applications, it may be desirable to utilize a curable material (such as an epoxy material) to form the undercoating or even a B-stageable material. In some embodiments, the undercoating may even be arranged to act as an underfill.

The resulting wafers and integrated circuits do not have a passivation layer that extends over the trim pads. Rather, the undercoating electrically isolates the trim pads. In some applications, the undercoating may have a thickness in the range of approximately 0.2 and 4 mils.

BRIEF DESCRIPTION OF THE DRAWINGS

The invention, together with further objects and advantages thereof, may best be understood by reference to the following description taken in conjunction with the accompanying drawings in which:

FIG. 1(*b*) illustrates in top perspective view a surface mount semiconductor die scribed from the wafer of FIG. 1.

FIG. 2(*b*) is a diagrammatic cross sectional view of the portion of a wafer illustrated in FIG. 2(*a*) after bumping and undergoing simultaneous testing and trim probing in accordance with an embodiment of the present invention.

FIG. 3 is a diagrammatic cross sectional view of the portion of a wafer illustrated in FIG. 2(*b*) after application of an undercoat in accordance with an embodiment of the present invention.

FIG. 4 is a process flow diagram illustrating a method of packaging, trimming and testing a wafer in accordance with one embodiment of the present invention.

FIG. 5 is a process flow diagram illustrating an earlier method of packaging, trimming and testing a wafer.

It is to be understood that, in the drawings, like reference numerals designate like structural elements. Also, it is understood that the depictions in the figures are diagrammatic in nature and not to scale.

DETAILED DESCRIPTION

In the described embodiments, a wafer is bumped prior to trimming. The bumped wafer may then be trimmed and final tested at substantially the same stage of wafer processing. The dice on the wafer are trimmed and tested using standard trim probing and test probing approaches. After the trimming and testing, an electrically insulative undercoating is applied to the active surface of the wafer. The undercoating directly covers the trim pads while leaving at least portions of the contact bumps exposed.

Figure 2A:
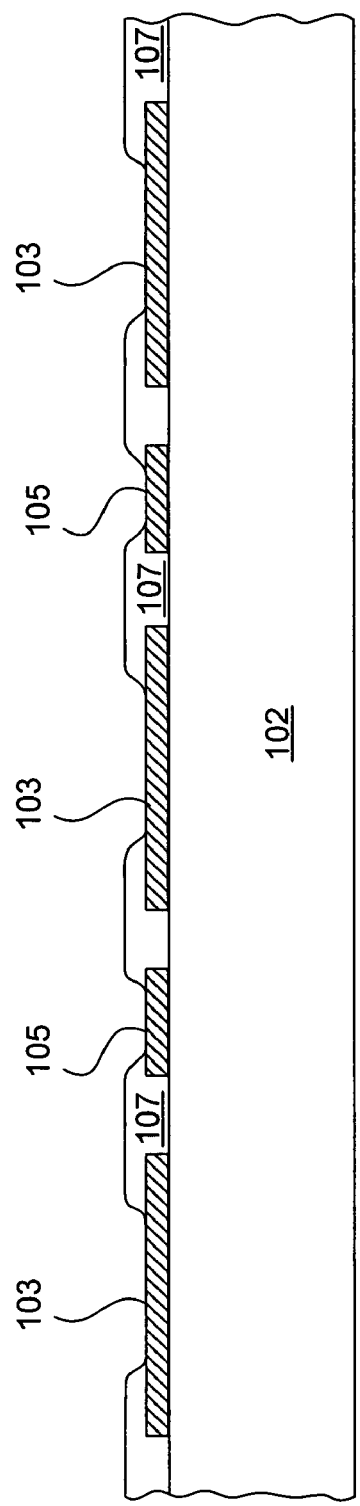
FIG. 2(*a*) is a diagrammatic cross sectional view of a portion of a wafer prior to bumping.

Referring initially to FIG. 4 in conjunction with FIG. 2(a), a method of fabricating a wafer in accordance with one embodiment of the invention will be described. Initially, a wafer 100 is fabricated using conventional and/or appropriate wafer fabrication techniques (400). As will be appreciated by those skilled in the art, there are a wide variety of suitable wafer fabrication techniques. The wafer generally will include a multiplicity of dice 102, which each include a number of I/O pads 103 and trim pads 105. FIG. 2(a) diagrammatically illustrates what a cross section of a suitable wafer might look like. Of particular note, a passivation layer 107 generally covers the top surface of the wafer. However, the passivation layer 107 has opening that expose the I/O pads 103 and trim pads 105.

When solder bumps are to be formed directly on the die, it is often desirable to form underbump metallization (UBM) stacks 110 over the I/O pads 103 to provide a good/non-corrosive adhesion base for the solder bumps. (Step 402). In the illustrated embodiment, corresponding metallization stacks 108 are also formed over the trim pads 105. When the trim pads 105 are formed from a material (e.g. aluminum) that oxidizes when exposed to air, it can be particularly advantageous to metalize the trim pads 105 in addition to the I/O pads 103. However, it should be appreciated that the trim pads could alternatively be masked so that the metallization stacks 108 are eliminated. After the underbump metallization stacks 110 have been formed, the wafer may be bumped by any of a wide variety of bumping processes (404). Typically, bumping involves forming solder balls on the underbump metallization stacks, however other suitable contact bump formation techniques (including non-solder based bump formation) can be used as well.

Figure 1A:
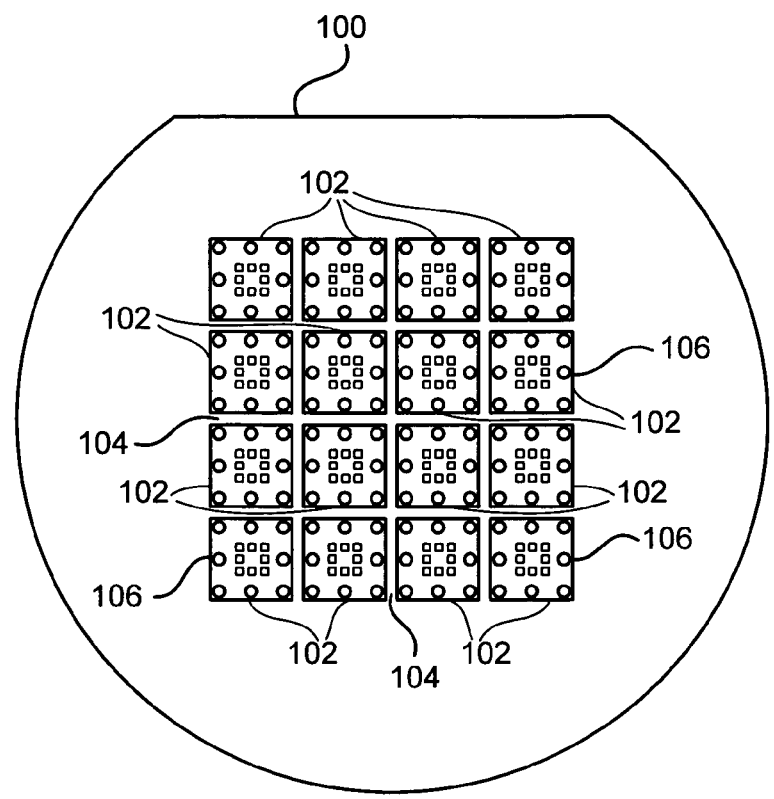
FIG. 1(*a*) illustrates in top plan view an exemplary wafer that has been formed in accordance with an embodiment the present invention.
Figure 1B:
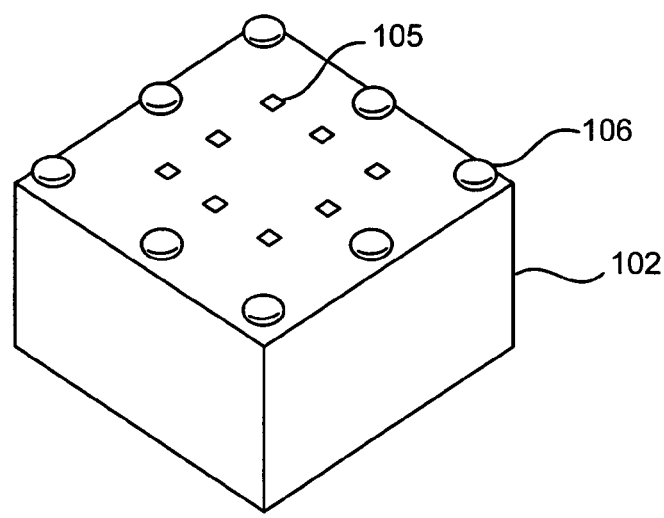

A representative resulting bumped wafer 100 is illustrated in FIG. 1. As seen therein, the representative wafer 100 includes a plurality of dice 102. Each of the dice 102 includes a plurality of solder balls, contacts or "bumps" 106 that are intended to be mounted directly onto contact pads of a substrate, such as a printed circuit board (PCB). The bumps 106 may be formed on the metallization stacks 108 as described above, directly on I/O pads on the die or redistributed using conventional redistribution techniques. (In the case of redistribution, if desired, the trim pads could also be redistributed). It should be noted that while only a relatively small number of dice 102 are shown on the wafer 100 for purposes of illustration, most wafers have significantly more dice formed thereon. By way of example, current state of the art wafers typically have several hundred to several thousand dice formed thereon, and some have more than ten thousand dice. As is well known in the art, most wafers and dice are formed of silicon, although any other appropriate semiconductor material can also be used, including, for example, gallium arsenide (GaAs), indium gallium phosphide, silicon germanium, and the like.

After the wafer has been bumped, other desired wafer level processing such as applying an opaque backcoating to the back surface of the wafer, wafer thinning, marking the wafer, etc. may be performed as desired (406). After the other desired wafer processing (if any) is performed, the wafer is trimmed and final tested (410). The trimming and final testing may be performed either sequentially (i.e., using two or more passes of the wafer prober) or simultaneously (i.e., using a single pass of the wafer prober). The step of wafer probing is diagrammatically illustrated in FIG. 2(b).

After the testing, an undercoating is applied to the active surface of the wafer (412). The structure of a representative wafer 100 having an undercoating 130 formed thereon is diagrammatically illustrated in FIG. 3. The undercoating 130 may be formed from a wide variety of materials. By way of example, a wide variety of polymer based materials including epoxies, polyimides, silicone-polymide copolymers or BCB work well. The undercoating can be applied using any of a variety of conventional coating techniques, including spin-on coating processes, molding processes, screen printing processes, stencil printing processes, etc. The important point is that an undercoating is used as opposed to a conventional semiconductor passivation material such as silicon-nitride or silicon-oxide. As will be appreciated by those skilled in the art, the deposition of a passivation material would require reintroduction of the wafer into a deposition chamber, whereas the simple application of an undercoating does not.

The described undercoating covers the trim pads thereby both electrically insulating the trim pads and isolating the trim pads from the surrounding environment (thereby lowering the risk of corrosion). Since the application of the undercoating (as well as any other wafer processing that occurs after the testing/trimming step is not expected, intended or likely to affect the electrical characteristics of the integrated circuits in any significant manner, there is generally no need to retest the dice at the wafer level after the undercoating has been applied. This is a significant advantage over approaches where the wafer is passivated and bumped after trimming. In those situations, it is generally considered necessary and important to retest the wafer after the passivation and bumping processes have been completed.

It should be appreciated that there are a number of existing processes that contemplate the application of an undercoating to the active surface of a wafer for a variety of different reasons. In many applications, the undercoating 130 used in the present invention may perform multiple functions including some of the functions performed by existing undercoatings. By way of example, U.S. Pat. Nos. 6,352,881 and 6,245,595 and pending application Ser. Nos. 10/080,913 and 10/224,291 (which are incorporated herein by reference) all describe the application of an underfill adhesive material to the front surface of the wafer. Some of the described embodiments utilize B-stageable materials (e.g. B-stageable epoxy materials) as the underfill material. If desired, the undercoating 130 may be an underfill material, as for example a B-stageable underfill material. It should be appreciated that generally, an underfill material is intended to fill the region between the die and a substrate that the die is mounted to after the wafer has been diced and the die mounted to the substrate. U.S. patent application Ser. No. 10/707,208 (which is incorporated herein by reference)

describes the use of a hardened undercoat material to constrain the interface between solder balls and their associated contact pads. The undercoating 130 may advantageously be used for this purpose as well. Still other undercoatings and/or underfill adhesives are designed to be optically opaque in order to protect the front surface of a die from exposure to light. Again, it should be appreciated that the undercoating 130 may be optically opaque to accomplish this function as well.

The thickness of the undercoating 130 may be varied widely depending on the needs of a particular situation. Typically undercoatings utilized as underfill materials will be thicker than undercoating that are not also used as underfill. In the illustrated embodiment, the undercoating (which is not used as an underfill) has a final thickness in the range of approximately 0.2 and 4 mils. In some applications, thicknesses in the range of 0.3 to 2 mils work well.

In the illustrated embodiment, the undercoating is formed from a curable material such as an epoxy resin. However, this is not a requirement. A wide variety of materials including thermosetting resins, thermoplastic materials, epoxies, polyimides, silicone-polymide copolymers may be used.

After the undercoating has been applied to the active surface of a wafer, then any additional wafer level processing that is desired may be performed, although it is generally preferable that only processes that are not expected to significantly impact the electrical characteristics of the integrated circuits be done after the wafer has been tested and trimmed. After any additional wafer level processing, the wafer may be singulated (414) using conventional wafer dicing techniques and the resulting dice may be handled as appropriate.

Although only a few embodiments of the invention have been described in detail, it should be appreciated that the invention may be implemented in many other forms without departing from the spirit or scope of the invention. In some circumstances, the ordering of the various described steps (and particularly the order of the other desired wafer processing steps) may be varied to suit the needs of a particular application. The undercoating coating may be formed from an opaque, partially opaque, a translucent or a transparent material.

In some embodiments, an opaque undercoating may be combined with a backcoating and/or wafer level side coating applications so that the dice are effectively encapsulated when they are singulated. The trim pads and contact pads may be formed from a wide variety of materials and/or stacks of materials. By way of example, common materials for use in the trim pads include aluminum, nickel, gold, copper, titanium, palladium, silver, chromium, tungsten and vanadium and various alloys that include some of these materials. Therefore, the present embodiments are to be considered as illustrative and not restrictive and the invention is not to be limited to the details given herein, but may be modified within the scope and equivalents of the appended claims.

What is claimed is:

1. A method comprising:
    providing a semiconductor wafer having a plurality of integrated circuit dice formed therein, the integrated circuit dice including a plurality of electrically conductive contact pads and solder-wettable electrically conductive trim pads exposed on an active surface of the wafer, wherein the trim pads are not covered by a passivation layer;
    forming contact bumps on a plurality of the contact pads, wherein the solder-wettable electrically conductive trim pads are exposed on the active surface of the wafer during the forming of the contact bumps;
    probing the wafer after the contact bumps have been formed, wherein the wafer probing includes,
        a trimming operation that includes directly probing solder-wettable portions of the plurality of exposed solder-wettable electrically conductive trim pads and trimming selected circuits associated with selected trims pads, and
        a testing operation that involves probing at least some of the plurality of contact bumps to test selected functionalities of the integrated circuits; and
    applying an electrically insulating undercoating to the active surface of the wafer that directly contacts and covers the solder-wettable trim pads while leaving at least portions of the contact bumps exposed, the undercoating being applied after the wafer probing, whereby the wafer may be trimmed and tested at substantially the same stage of wafer processing.

2. A method as recited in claim 1 wherein the probing for the trimming and testing operations is performed sequentially.

3. A method as recited in claim 1 wherein the probing for the trimming and testing operations are performed substantially simultaneously.

4. A method as recited in claim 1 wherein the undercoating is formed from a material selected from the group consisting of: epoxies, polyimides, and silicone-polyimide copolymers.

5. A method as recited in claim 1 wherein the undercoating has a final thickness in the range of approximately 0.2 and 4 mils.

6. A method as recited in claim 1 wherein the undercoating is formed from an underfill material that is suitable for filling a region between a die and a substrate that the die is mounted to after the wafer has been diced and the die mounted to the substrate.

7. A method as recited in claim 1 wherein the undercoating is formed from a B-stageable material.

8. A method as recited in claim 1 wherein the undercoating is formed from a curable material, the method further comprising curing the undercoating to permanently affix the undercoating to the surface of the wafer.

9. A method as recited in claim 1 wherein the undercoating is applied by one of a spin-on coating process, a molding process, a screen printing process and a stencil printing process.

10. A method as recited in claim 1 wherein the contact pads each include a metallization stack.

11. A method as recited in claim 10 wherein the trim pads each include a metallization stack.

12. A method as recited in claim 1 further comprising dicing the wafer after the undercoating has been applied to provide a multiplicity of singulated dice each having an undercoat thereon.

13. A method comprising:
    providing a semiconductor wafer having a plurality of integrated circuit dice formed therein, the integrated circuit dice including a plurality of electrically conductive contact pads and solder-wettable electrically conductive trim pads exposed on an active surface of the wafer, wherein the trim pads are not covered by a passivation layer;
    forming contact bumps on a plurality of the contact pads, wherein the solder-wettable electrically conductive trim pads are exposed on the active surface of the wafer during the forming of the contact bumps;

probing the wafer after the contact bumps have been formed, wherein the wafer probing includes, a trimming operation that includes directly probing solder-wettable portions of the plurality of exposed solder-wettable electrically conductive trim pads and trimming selected circuits associated with selected trims pads, and a testing operation that involves probing at least some of the plurality of contact bumps to test selected functionalities of the integrated circuits; and applying an electrically insulating undercoating to the active surface of the wafer that directly contacts and covers the solder-wettable trim pads while leaving at least portions of the contact bumps exposed, the undercoating being formed from a polymer based adhesive material selected from the group consisting of: epoxies, polyimides, silicone-polyimide copolymers, and BCB and wherein, the undercoating has a final thickness in the range of approximately 0.2 and 4 mils.

the undercoating is applied after the wafer probing, whereby the wafer may be trimmed and tested at substantially the same stage of wafer processing; and dicing the wafer after the undercoating has been applied to provide a multiplicity of singulated dice each having an undercoat thereon.

* * * * *